(12) United States Patent
Woods

(10) Patent No.: US 6,259,285 B1
(45) Date of Patent: *Jul. 10, 2001

(54) METHOD AND APPARATUS FOR DETECTING SUPPLY POWER LOSS

(75) Inventor: Gregory K. Woods, Cornelius, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/985,982

(22) Filed: Dec. 5, 1997

(51) Int. Cl.$^7$ ........................................ H03L 7/00
(52) U.S. Cl. ............................................. 327/143
(58) Field of Search .................................. 327/142, 143, 327/198

(56) References Cited

U.S. PATENT DOCUMENTS

| | | | |
|---|---|---|---|
| 4,591,745 | * 5/1986 | Shen | 307/592 |
| 4,607,178 | * 8/1986 | Sugie et al. | 307/594 |
| 4,611,126 | * 9/1986 | Miller | 307/64 |
| 5,030,845 | * 7/1991 | Love et al. | 307/272.3 |
| 5,331,209 | * 7/1994 | Fujisawa et al. | 307/296.4 |
| 5,394,104 | * 2/1995 | Lee | 327/143 |
| 5,463,336 | * 10/1995 | Gupta et al. | 327/143 |
| 5,485,111 | * 1/1996 | Tanimoto | 327/143 |
| 5,528,184 | * 6/1996 | Gola et al. | 327/198 |
| 5,565,807 | * 10/1996 | Ward | 327/205 |
| 5,617,048 | * 4/1997 | Ward et al. | 327/143 |
| 5,703,510 | * 12/1997 | Iketani et al. | 327/143 |
| 5,721,887 | * 2/1998 | Nakajima | 395/555 |
| 5,734,280 | * 3/1998 | Sato | 327/143 |
| 5,770,959 | * 6/1998 | Hopkins et al. | 327/143 |
| 5,844,429 | * 12/1998 | Cho | 327/68 |
| 5,929,672 | * 7/1999 | Mitani | 327/143 |
| 5,929,673 | * 7/1999 | Haigis et al. | 327/143 |

* cited by examiner

*Primary Examiner*—Jeffrey Zweizig
(74) *Attorney, Agent, or Firm*—Blakely, Sokoloff, Taylor & Zafman LLP

(57) ABSTRACT

A circuit includes a fixed voltage drop circuit, a delay circuit, and a buffer. The delay circuit 13 coupled to the fixed voltage drop circuit, and the buffer 13 coupled to the delay circuit. The buffer has an activation voltage and is adapted to activate when the output of the delay circuit is less than the activation voltage. A method for detecting the loss of a power supply voltage includes coupling the power supply to a fixed voltage drop element to provide a first voltage at an output of the fixed voltage drop element. The first voltage is delayed to provide a second voltage, and the second voltage is provided to a buffer having an activation voltage. A reset signal is asserted at an output of the buffer when the second voltage is less than the activation voltage.

18 Claims, 3 Drawing Sheets

METHOD AND APPARATUS FOR DETECTING SUPPLY POWER LOSS

BACKGROUND OF THE INVENTION

1. FIELD OF THE INVENTION

The present invention relates to the field of computer systems. More specifically, the present invention relates to the art of detecting supply power loss to prevent unpredictable component behavior.

2. DESCRIPTION OF RELATED ART

Digital systems are sensitive to power supply perturbations. Momentary losses of power or sags in line voltage, otherwise known as voltage brownouts, can cause unpredictable behavior in digital systems. When the supply voltage in a digital system sage below a valid level, but not completely to zero before being restored, a digital state machine can transition to an invalid state, thus causing the unpredictable behavior.

To ensure proper operation following a brownout event, digital systems typically include power loss detection and reset signal generation circuitry. One known method for detecting power supply loss includes using the power supply voltage, an RC delay and a logic gate. In cases where the brownout is a voltage sag that dips below a valid level for the system, but not all the way to zero, such circuitry can malfunction, thus compromising system integrity. One reason for such a malfunction is that the perturbation in the power supply voltage often affects the supply voltage of the logic gate, thus affecting the voltage at which the gate activates, preventing the gate from functioning properly. A second known method for detecting power supply loss entails the use of a voltage reference device and a threshhold detection circuit. This implementation is cost prohibitive for many applications, particularly when implemented at the circuit board level.

The present invention is directed to overcoming, or at least reducing the effects of, one or more of the problems set forth above by providing a novel and nonobvious low-cost method and apparatus for detecting power supply perturbations and asserting a reset signal.

SUMMARY OF THE INVENTION

An aspect of the invention is seen in a circuit including a fixed voltage drop circuit, a delay circuit, and a buffer. The delay circuit is coupled to the fixed voltage drop circuit, and the buffer is coupled to the delay circuit. The buffer has an activation voltage and is adapted to activate when the output of the delay circuit is less than the activation voltage.

Another aspect of the invention is seen in a method for detecting the loss of a power supply voltage. The method includes coupling the power supply to a fixed voltage drop element to provide a first voltage at an output of the fixed voltage drop element. The first voltage is delayed to provide a second voltage, and the second voltage is provided to a buffer having an activation voltage. A reset signal is asserted at an output of the buffer when the second voltage is less than the activation voltage.

Figure 1:
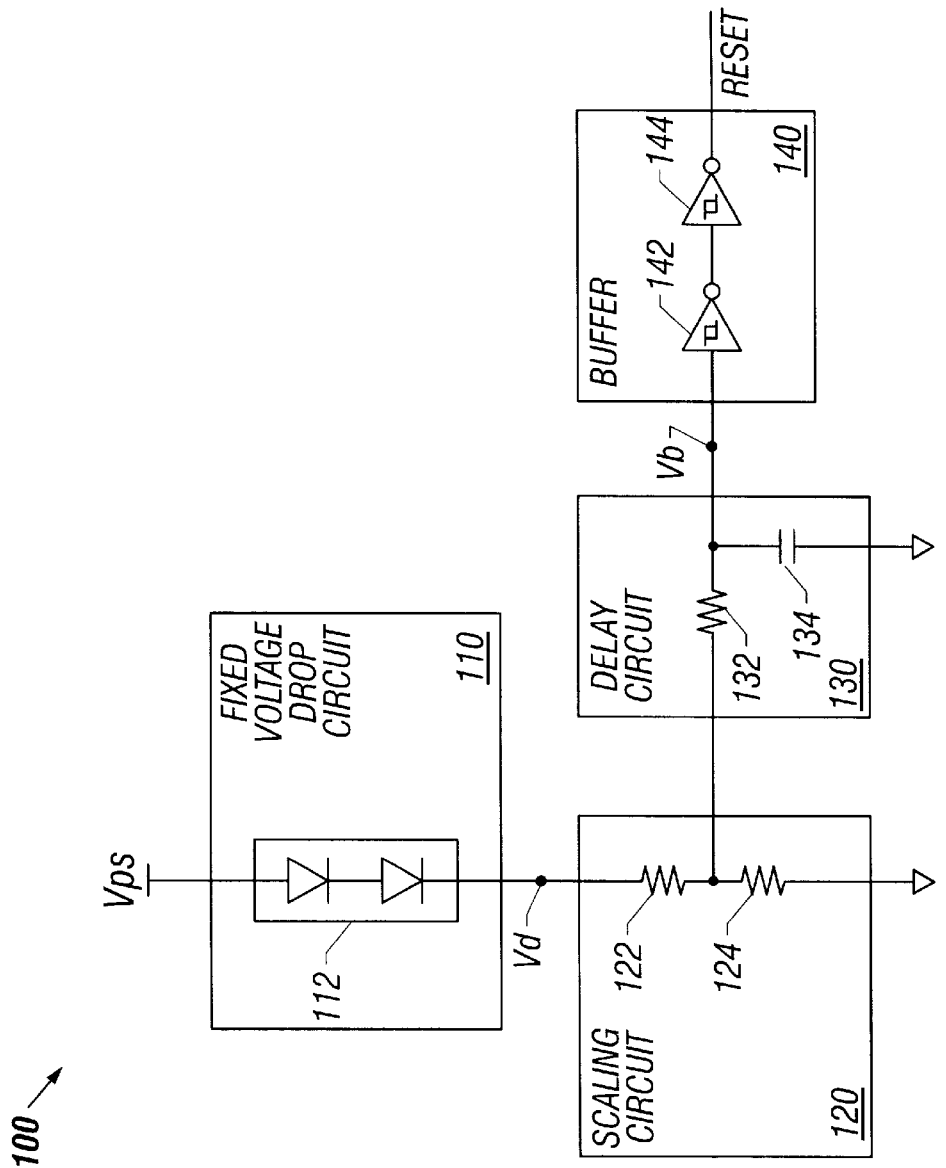
FIG. 1 is a circuit diagram of a power loss detection circuit of the invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

The following examples are included to demonstrate preferred embodiments of the invention. It should be appreciated by those skilled in the art that the techniques disclosed in the examples that follow represent techniques discovered by the inventor to function well in the practice of the invention. However, those skilled in the art should, in light of the present disclosure, appreciate that many changes can be made in the specific embodiments disclosed herein without departing from the spirit and scope of the invention.

Referring first to FIG. 1, one embodiment of a circuit 100 for detecting a loss of power supply voltage is shown. The power loss detection circuit 100 is made up of a number of sub-circuits. The specific elements of the sub-circuits are included for illustrative purposes. It is contemplated that other specific elements may be used to accomplish a similar function for a particular sub-circuit. The power loss detection circuit 100 includes a fixed voltage drop circuit 110 connected to the power supply, Vps (e.g., 5V), being monitored. The fixed voltage drop circuit 110 provides a voltage, Vd, that is lower than Vps by an essentially fixed amount. The fixed voltage drop circuit 110 is connected to a scaling circuit 120 that outputs a voltage equal to a percentage of its input, voltage Vd. The scaling circuit 120 is connected to a delay circuit 130 that provides an output, voltage Vb, that is slightly delayed from its input transitions in voltage Vd. The delay circuit 130 filters out rapid perturbations in the power supply voltage, Vps. The delay circuit 130 is connected to a buffer 140 having an activation voltage, Vba (shown in FIG. 2). When the input voltage Vb seen by the buffer 140 falls below the activation voltage, Vba, the buffer 140 provides an asserted low reset signal. The delay circuit 130 also delays the deassertion of the reset signal during power-up. The delay circuit 130 holds the reset signal active until the power supply voltage, Vps, has reached a valid level and stabilized.

The minimum allowable level of the power supply voltage, Vps, corresponding to the activation voltage Vba is selected depending on the minimum valid voltage level tolerable by the digital system being monitored. Power supply voltages lower than the minimum valid voltage level may cause unpredictable behavior in the digital system if operation is continued below that level.

In the illustrated embodiment, the fixed voltage drop circuit 110 is a dual diode 112. The dual diode 112 provides a fixed voltage drop of approximately 1.2–1.4 volts (i.e., 0.6–0.7 V for each diode). It is contemplated that the fixed voltage drop circuit may include any number of dual diodes 112, discrete diodes (not shown), or other solid state devices, depending on the desired fixed voltage drop. The voltage drop across the dual diode 112 is only slightly dependent on the magnitude of Vps, resulting in a nearly absolute voltage drop. In the illustrated embodiment, the dual diode 112 chosen is typically less costly than two discrete diodes. Also, a dual diode 112 is contained in a single package, which enhances the efficiency of the manufacturing process because only one element must be placed on the circuit board.

In the illustrated embodiment, the scaling circuit 120 includes two series resistors 122, 124 connected to ground. The voltage between the two resistors 122, 124, which is proportional to the input voltage, Vd, is provided as the output of the scaling circuit. The scaling circuit 120 allows the setpoint of the power loss detection circuit 100 to be adjusted to suit specific system requirements. The total resistance of the resistors 122, 124 is preferably sufficiently small in magnitude to allow enough current to pass through the dual diode 112 to bias each diode in the linear section of its voltage-current operating curve.

It is conceivable that the fixed voltage drop circuit 110 and buffer activation voltage, Vba, could be matched such that no scaling was necessary for the circuit to operate at the desired setpoint. In that case, the power loss detection circuit 100 could be implemented without a scaling circuit 120. A single resistor can be added between the dual diode 112 and ground to establish sufficient bias current through the dual diode 112 such that it operates in the linear region of its voltage-current operating curve. In some embodiments, there will be some degree of mismatch between the voltage after the fixed voltage drop circuit 110 and the activation voltage of the buffer 140 with respect to the desired setpoint. Adjusting the values of the resistors 122, 124 allows flexibility for circuit configuration. It is also contemplated that other resistive elements, such as an active transistor, may be used in the scaling circuit 120.

The delay circuit 130 includes a resistor 132 and capacitor 134 that cooperate to form an RC delay. One function of the delay circuit 130 is to delay the de-assertion of the reset signal during a power-up following the reset. The delay is required to allow the power supply voltage, Vps, to reach a valid level and stabilize prior to the activation of the digital components that rely on the power supply voltage, Vps.

The buffer 140 includes two inverting hysteresis buffers 142, 144. It is contemplated that the buffer 140 may include other arrangements, such as a single non-inverting buffer (not shown). The buffer 140 may also include elements that do not have an associated hysteresis. In the illustrated embodiment, the buffers 142, 144 activate in response to a falling edge at approximately 1.5V and deactivate in response to a rising edge at approximately 2V.

Figure 2:
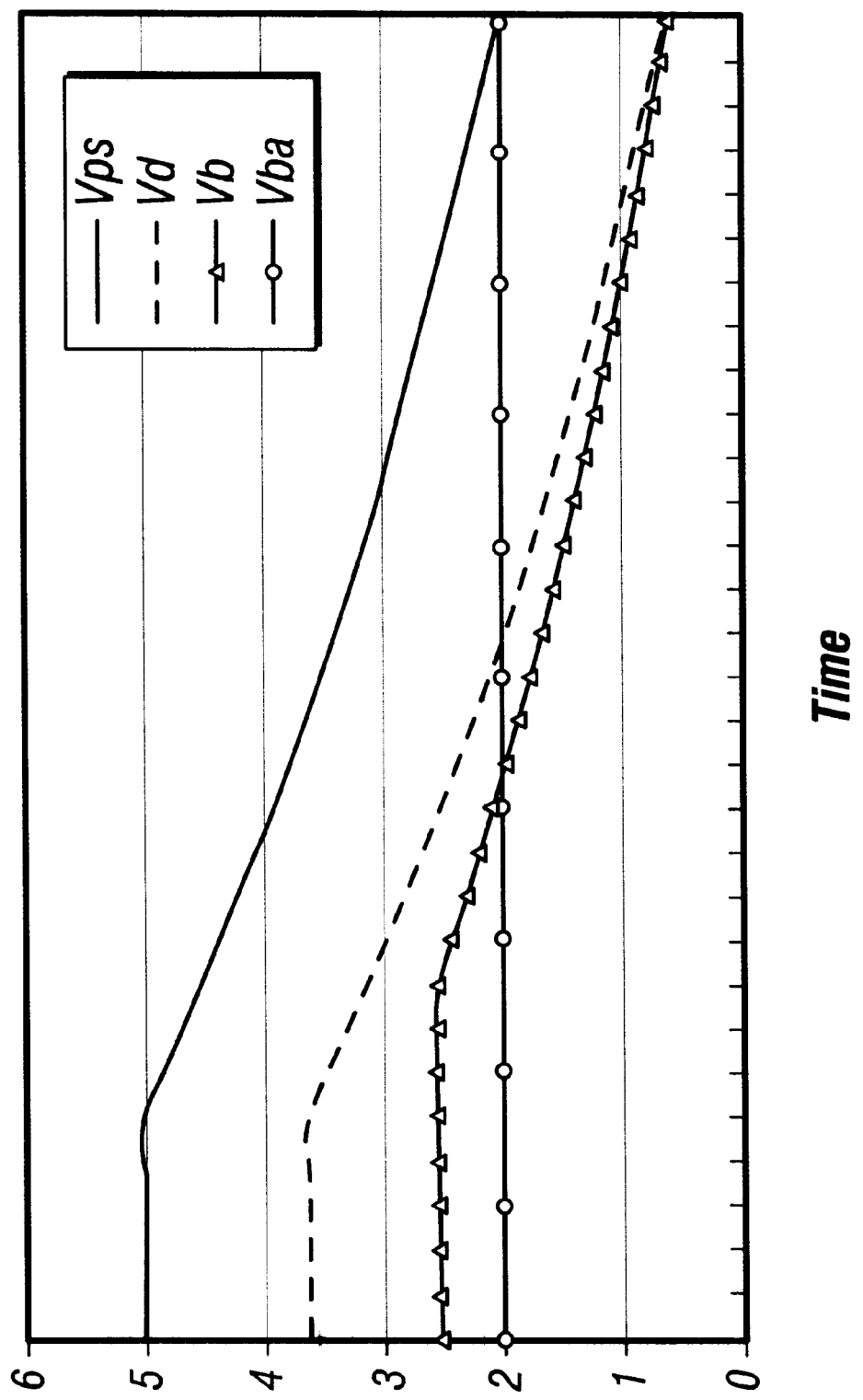
FIG. 2 is a graph of the voltage present at certain points within the circuit of FIG. 1 during a power supply perturbation.

The operation of the power loss detection circuit 100 is further illustrated in reference to FIG. 2. FIG. 2 is provided for illustrative purposes. FIG. 2 does not represent an actual circuit simulation. Therefore, the time scale is not included and the curves represent only a qualitative example of the power loss detection circuit 100 response.

FIG. 2 includes the power supply voltage Vps, the voltage seen at the output terminal of the fixed voltage drop circuit 110, Vd, the voltage seen at the input terminal of the buffer 140, Vb, and the activation voltage of the buffer 140, Vba.

After a loss of power, the power supply voltage Vps will decay. The voltage seen at the output terminal of the fixed voltage drop circuit 110 will always be essentially a fixed voltage (~1.4V) below Vps. As described above, the scaling circuit 130 allows the circuit 100 to be configured such that the buffer 140 activates at the desired setpoint. After some delay period, the scaled input voltage, Vb, to the buffer 140 will decay to the activation voltage, Vba, of the buffer 140 and the buffer 140 will activate, thus providing an asserted low reset signal. At some later point in time, the power supply voltage, Vps will rise above the desired setpoint, and the buffer 140 will deactivate and the reset signal will be deasserted following a short period of time determined by the delay circuit 130.

If the fixed voltage drop circuit 110 were absent from the power loss detection circuit 100, certain voltage transients may have common effects on both the power supply voltage, Vps, and the input supply voltage, Vb, for the buffer 140. As the power supply to the buffer 140 sags, its activation voltage, Vba, will also change, making it possible for the power supply voltage, Vps, to decay below the desired operating point without triggering the buffer 140. The fixed voltage drop circuit 110, because it is relatively independent of the power supply voltage, Vps, causes the buffer 140 to trigger even if its power supply has sagged.

Figure 3:
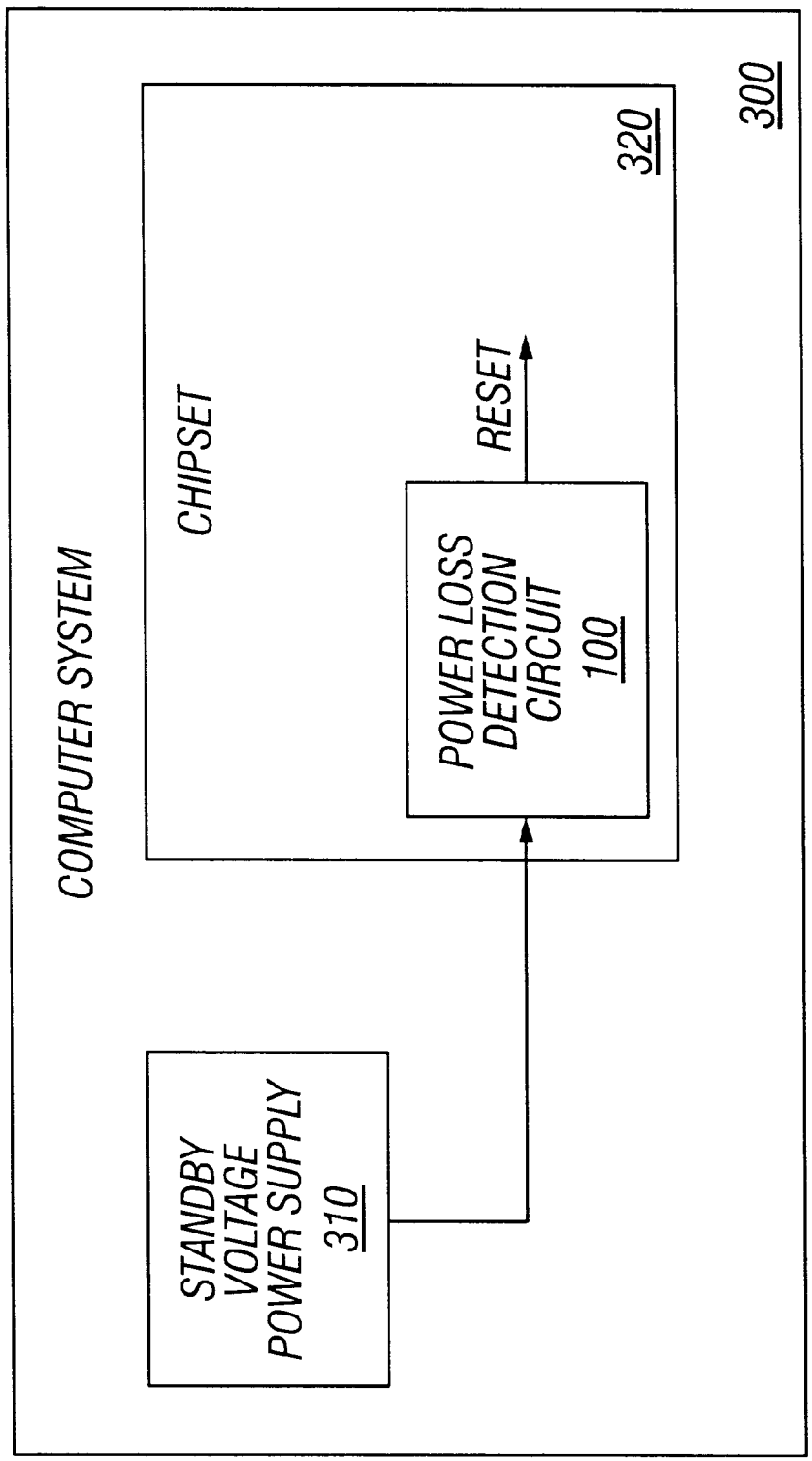
FIG. 3 is a block diagram of a computer system including the power loss detection circuit of FIG. 1.

A simplified block diagram of a digital system sensitive to voltage brownouts is shown in FIG. 3. In FIG. 3, the digital system is a computer system 300 containing a processor such as a Pentium II®, offered by Intel Corporation, of Santa Clara, Cailf. In the Pentium II® system, the standby voltage power supply 310 is monitored by the power load detection circuit 100 in the chipset 320 to detect loss of power. Unpredictable behavior has been identified in systems with other power loss detection circuits that experience brown-outs of less than approximately 17 seconds. The power loss detection circuit 100 allows such voltage transients to be detected and reset signals asserted before system integrity is compromised.

While the invention is susceptible to various modifications and alternative forms, specific embodiments have been shown by way of example in the drawings and have been described in detail herein. However, it should be understood that the invention is not intended to be limited to the particular forms disclosed. It will be appreciated by those of ordinary skill having the benefit of this disclosure that numerous variations from the foregoing illustrations will be possible without departing from the inventive concept described herein. Accordingly, it is the claims set forth below, and not merely the foregoing illustration, which are intended to define the exclusive rights claimed in this application.

What is claimed is:

1. A method comprising:
   applying a power supply voltage to a fixed voltage drop circuit to provide a dropped voltage substantially fixed below the power supply voltage;
   scaling the dropped voltage to provide a scaled voltage;
   delaying the scaled voltage to provide a delayed voltage, wherein the delaying comprises delaying the scaled voltage with a resistor-capacitor delay circuit;
   applying the delayed voltage to a buffer having an activation voltage; and
   asserting a reset signal at an output of the buffer when the delayed voltage is less than the activation voltage, wherein the buffer comprises a plurality of inverting hysteresis buffers.

2. The method of claim 1, wherein the applying the power supply voltage comprises applying the power supply voltage to a diode.

3. The method of claim 1, wherein the scaling comprises scaling the dropped voltage with a voltage divider.

4. The method of claim 1, wherein the asserting comprises asserting a low reset signal when the delayed voltage is less than the activation voltage.

5. The method of claim 1, wherein the applying the power supply voltage comprises applying the power supply voltage to a dual diode.

6. The method of claim 3, wherein the voltage divider comprises a plurality of resistors.

7. A circuit comprising:
a fixed voltage drop circuit to provide a dropped voltage substantially fixed below a power supply voltage;
a scaling circuit coupled to the fixed voltage drop circuit to scale the dropped voltage;
a delay circuit coupled to the scaling circuit to delay the scaled voltage, wherein the delay circuit comprises a resistor-capacitor delay circuit; and
a buffer coupled to the delay circuit, the buffer having an activation voltage to assert a reset signal when the delayed voltage is less than the activation voltage, the buffer comprising a plurality of inverting hysteresis buffers.

8. The circuit of claim 7, wherein the fixed voltage drop circuit comprises a diode.

9. The circuit of claim 7, wherein the scaling circuit comprises a voltage divider.

10. The circuit of claim 7, wherein the buffer is to assert a low reset signal when the delayed voltage is less than the activation voltage.

11. The circuit of claim 7, wherein the fixed voltage drop circuit comprises a dual diode.

12. The circuit of claim 9, wherein the voltage divider comprises a plurality of resistors.

13. A computer system comprising:
(a) a power supply to provide a power supply voltage; and
(b) a chipset comprising:
(i) a fixed voltage drop circuit coupled to the power supply to provide a dropped voltage substantially fixed below the power supply voltage,
(ii) a scaling circuit coupled to the fixed voltage drop circuit to scale the dropped voltage,
(iii) a delay circuit coupled to the scaling circuit to delay the scaled voltage, wherein the delay circuit comprises a resistor-capacitor delay circuit, and
(iv) a buffer coupled to the delay circuit, the buffer having an activation voltage to assert a reset signal when the delayed voltage is less than the activation voltage, the buffer comprising a plurality of inverting hysteresis buffers.

14. The computer system of claim 13, wherein the buffer is to assert a low reset signal when the delayed voltage is less than the activation voltage.

15. The computer system of claim 13, wherein the fixed voltage drop circuit comprises a diode.

16. The computer system of claim 13, wherein the scaling circuit comprises a voltage divider.

17. The computer system of claim 13, wherein the fixed voltage drop circuit comprises a dual diode.

18. The computer system of claim 16, wherein the voltage divider comprises a plurality of resistors.

* * * * *

UNITED STATES PATENT AND TRADEMARK OFFICE
CERTIFICATE OF CORRECTION

PATENT NO. : 6,259,285 B1
DATED : July 10, 2001
INVENTOR(S) : Woods

It is certified that error appears in the above-identified patent and that said Letters Patent is hereby corrected as shown below:

Column 1,
Line 16, delete "sage", insert -- sags --.

Column 4,
Line 21, delete "load", insert -- loss --.

Signed and Sealed this

Seventeenth Day of December, 2002

JAMES E. ROGAN
*Director of the United States Patent and Trademark Office*